(12) United States Patent
Sakota (10) Patent No.: US 9,761,630 B2
(45) Date of Patent: Sep. 12, 2017

(54) METHOD FOR MANUFACTURING IMAGE PICKUP MODULE

(71) Applicant: SHARP KABUSHIKI KAISHA, Osaka-shi, Osaka (JP)

(72) Inventor: Naoki Sakota, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 14/959,027

(22) Filed: Dec. 4, 2015

(65) Prior Publication Data
US 2016/0086986 A1  Mar. 24, 2016

Related U.S. Application Data

(62) Division of application No. 14/387,123, filed as application No. PCT/JP2013/055730 on Mar. 1, 2013.

(30) Foreign Application Priority Data

Mar. 26, 2012  (JP) ................................ 2012-070176

(51) Int. Cl.
*H01L 27/146* (2006.01)
*H04N 5/225* (2006.01)

(52) U.S. Cl.
CPC .... *H01L 27/1469* (2013.01); *H01L 27/14618* (2013.01); *H01L 27/14683* (2013.01);
(Continued)

(58) Field of Classification Search
CPC .......... H01L 27/1469; H01L 27/14685; H01L 27/14618; H01L 27/14683;
(Continued)

(56) References Cited

U.S. PATENT DOCUMENTS 5,506,401 A * 4/1996 Segawa ............. H01L 27/14618
250/208.1
5,786,589 A 7/1998 Segawa et al.
(Continued)

FOREIGN PATENT DOCUMENTS

JP  7-99214  4/1995
JP  2001-177081  6/2001
(Continued)

OTHER PUBLICATIONS

Advisory Action for U.S. Appl. No. 14/387,123 dated Jan. 14, 2016; Sakota.
(Continued)

*Primary Examiner* — Marc Armand
*Assistant Examiner* — Sue Tang
(74) *Attorney, Agent, or Firm* — Nixon & Vanderhye P.C.

(57) ABSTRACT

The present invention achieves reduction in size and thickness while removing the cause of defective image and the like. According to an image pickup module (1), a solid-state image pickup device (3) and a flexible substrate (2) are connected to each other by flip-chip bonding, and an opening (5) is formed in the flexible substrate 2 by melting the flexible substrate (2) and an anisotropically-conductive film (8) adhered to the flexible substrate (2).

1 Claim, 7 Drawing Sheets

(52) U.S. Cl.
CPC ..... *H01L 27/14685* (2013.01); *H04N 5/2257* (2013.01); *H01L 27/14601* (2013.01); *H01L 2224/16225* (2013.01)

(58) Field of Classification Search
CPC .... H01L 2224/16225; H01L 27/14601; H04N 5/2257
See application file for complete search history.

(56) References Cited

U.S. PATENT DOCUMENTS

| | | | |
|---|---|---|---|
| 5,918,113 A * | 6/1999 | Higashi | H01L 21/563 257/E21.503 |
| 6,011,294 A | 1/2000 | Wetzel | |
| 7,242,538 B2 * | 7/2007 | Minamio | H01L 27/14618 257/680 |
| 7,391,227 B2 * | 6/2008 | Inoue | G01R 1/0735 324/755.09 |
| 8,420,995 B2 | 4/2013 | Mori et al. | |
| 2001/0030276 A1 | 10/2001 | Hoshino | |
| 2001/0048064 A1 | 12/2001 | Kitani | |
| 2002/0020927 A1 * | 2/2002 | Akram | H01L 23/13 257/781 |
| 2004/0061799 A1 | 4/2004 | Atarashi et al. | |
| 2007/0008477 A1 | 1/2007 | Huang | |
| 2007/0111391 A1 * | 5/2007 | Aoki | H01Q 1/38 438/118 |
| 2008/0144048 A1 | 6/2008 | Ikebe et al. | |
| 2010/0053924 A1 | 3/2010 | Ueshima | |
| 2011/0051124 A1 * | 3/2011 | Wang | H01L 21/681 356/51 |
| 2011/0084118 A1 | 4/2011 | Wada et al. | |

FOREIGN PATENT DOCUMENTS

| | | |
|---|---|---|
| JP | 2001-203913 | 7/2001 |
| JP | 2007-189049 | 7/2007 |
| JP | 2011-82458 | 4/2011 |
| TW | 200631151 | 9/2006 |
| TW | 200702861 | 1/2007 |
| TW | 200522341 | 7/2015 |

OTHER PUBLICATIONS

Office Action for U.S. Appl. No. 14/387,123 dated Mar. 28, 2016; Sakota.
U.S. Appl. No. 14/387,123, filed Sep. 22, 2014; Sakota.
International Search Report for PCT/JP2013/055730 dated Apr. 2, 2013.
Written Opinion of the International Searching Authority for PCT/JP2013/055730 dated Apr. 2, 2013.
"Final" Office Action for U.S. Appl. No. 14/387,123 dated Sep. 14, 2015.
Office Action for U.S. Appl. No. 14/387,123 dated Apr. 29, 2015.
Election/Restriction for Application U.S. Appl. No. 14/387,123 dated Feb. 18, 2015.
Office Action for U.S. Appl. No. 14/387,123 dated Sep. 16, 2016; Sakota.
Office Action for U.S. Appl. No. 14/387,123 dated Jan. 11, 2017; Sakota.

* cited by examiner

IMAGE PICKUP MODULE VIEWED IN
DIRECTION CC (IMAGE PICKUP DEVICE SIDE)

FIG. 5

POSITIONAL RELATION BETWEEN TERMINAL AND BUMP

METHOD FOR MANUFACTURING IMAGE PICKUP MODULE

This application is a Divisional of Ser. No. 14/387,123, filed Sep. 22, 2014, which is the U.S. national phase of International Application No. PCT/JP2013/055730, filed 1 Mar. 2013, which designated the U.S. and claims priority to JP 2012-070176, filed 26 Mar. 2012, the entire contents of each of which are all hereby incorporated herein by reference.

TECHNICAL FIELD

The present invention relates to (i) an image pickup module which includes a solid-state image pickup device and (ii) a method for manufacturing the image pickup module.

BACKGROUND ART

In recent years, image pickup apparatuses are widely used each of which includes a solid-state image pickup device (photoelectric conversion element) such as a CCD (charge-coupled device). Such image pickup apparatuses are employed for vehicles, for information communication terminals, for medical purposes, and the like, and are demanded to be smaller and thinner.

Figure 7:
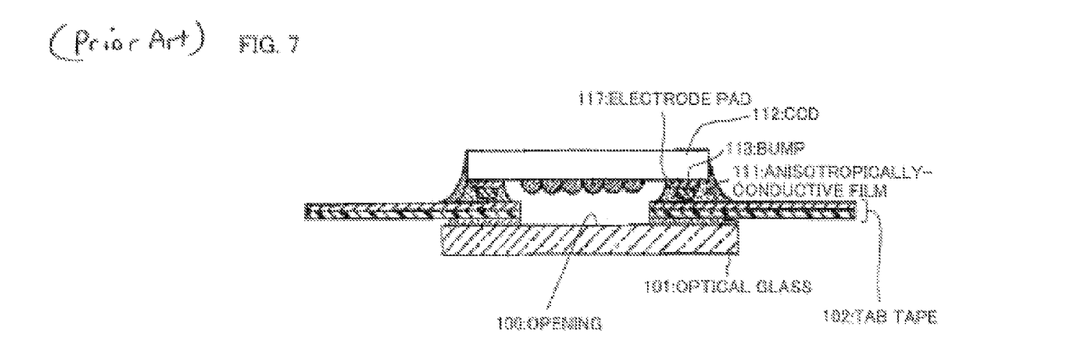
FIG. 7 is a view for explaining a conventional technique.

Under the circumstances, Patent Literature 1 discloses a configuration in which optical glass is used as a substrate. The following description will discuss details of this with reference to FIG. 7. FIG. 7 is a view illustrating the configuration disclosed in Patent Literature 1. Patent Literature 1 discloses a photoelectric conversion apparatus in which (i) a TAB tape 102, which is made of an insulating sheet on which a plurality of copper leads are formed, is adhered to an optical glass 101 and (ii) a CCD 112 is provided so as to face the optical glass 101 via an opening 106 (see FIG. 7).

Figure 8:
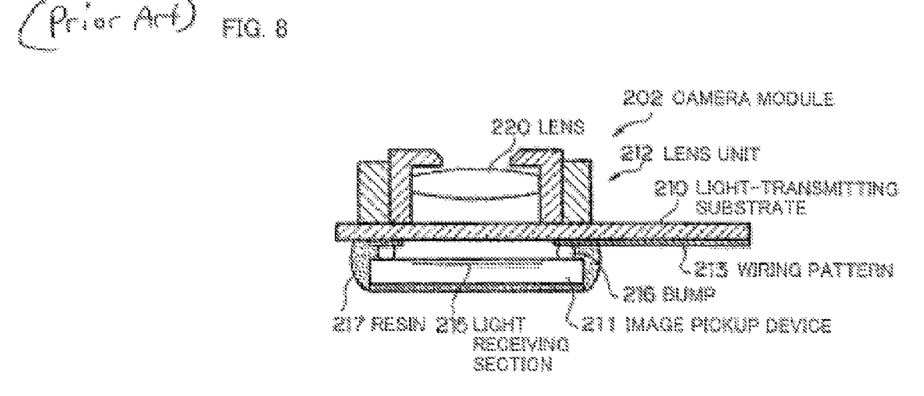
FIG. 8 is a view for explaining a conventional technique.

Moreover, Patent Literature 2 discloses a configuration in which a substrate and an image pickup device are connected to each other by flip-chip bonding. The following description will discuss details of this with reference to FIG. 8. FIG. 8 is a view illustrating the configuration disclosed in Patent Literature 2. Patent Literature 2 discloses a camera module 202 in which a wiring pattern 213, which is formed on an entire surface of a light-transmitting substrate 210, is connected to an image pickup device 211 via a bump 216 by flip-chip bonding (see FIG. 8).

CITATION LIST

Patent Literature

[Patent Literature 1]
Japanese Patent Application Publication Tokukaihei No. 7-99214 (Publication date: Apr. 11, 1995)
[Patent Literature 2]
Japanese Patent Application Publication Tokukai. No. 2001-203913 (Publication date: Jul. 27, 2001)

SUMMARY OF INVENTION

Technical Problem

However, the conventional configurations have the following problems. That is, according to the configuration disclosed in Patent Literature 1, a burr, cutting chips, resin powder, and the like are generated from an opening edge of the TAB tape 102 in manufacturing, and such dusts fall onto a light receiving surface of the CCD solid-state image pickup device, and this may therefore cause a defective image and the like.

According to the configuration of Patent Literature 2, the light-transmitting substrate 210 is made of glass. The glass is a fragile material, and is therefore limited in slimness, and this consequently interferes with reduction in thickness.

The present invention is accomplished in view of the problems, and its object is to provide an image pickup module and the like which can achieve reduction in size and thickness while removing a cause of a problem such as a defective image which is caused when dust and the like stick to an image pickup device.

Solution to Problem

In order to attain the object, an image pickup module of the present invention includes: a solid-state image pickup device having a light receiving section and an electrode pad; a substrate having an opening, a wiring pattern which is connected to the electrode pad by flip-chip bonding being formed on the substrate; an anisotropically-conductive film which is adhered to the substrate so that the substrate and the solid-state image pickup device are connected to each other via the anisotropically-conductive film; and a light-transmitting member provided in the opening, the light-transmitting member causing light to pass through so that the light is to be received by the light receiving section, the opening being formed by melting the substrate and the anisotropically-conductive film, and at an edge of the opening, the anisotropically-conductive film being hardened while retaining a melted shape which has been formed by the melting.

A method of the present invention for manufacturing an image pickup module is a method for manufacturing an image pickup module in which a solid-state image pickup device having an electrode pad is provided on a substrate on which a wiring pattern is formed, the method including the steps of: (a) adhering an anisotropically-conductive film to the substrate; (b) forming an opening by melting a periphery of a part to be cut out of the substrate to which the anisotropically-conductive film has been adhered; (c) providing a light-transmitting member in the opening; and (d) connecting, by flip-chip bonding, the wiring pattern of the substrate to the electrode pad of the solid-state image pickup device via a bump such that a light receiving section of the solid-state image pickup device receives light which has passed through the light-transmitting member.

Advantageous Effects of Invention

As above described, the image pickup module of the present invention includes: a solid-state image pickup device having a light receiving section and an electrode pad; a substrate having an opening, a wiring pattern which is connected to the electrode pad by flip-chip bonding being formed on the substrate; an anisotropically-conductive film which is adhered to the substrate so that the substrate and the solid-state image pickup device are connected to each other via the anisotropically-conductive film; and a light-transmitting member provided in the opening, the light-transmitting member causing light to pass through so that the light is to be received by the light receiving section, the opening being formed by melting the substrate and the anisotropically-conductive film, and at an edge of the opening, the anisotropically-conductive film being hardened while retaining a melted shape which has been formed by the melting.

Moreover, the method of the present invention for manufacturing the image pickup module includes the steps of; (a) adhering an anisotropically-conductive film to the substrate; (b) forming an opening by melting a periphery of a part to be cut out of the substrate to which the anisotropically-conductive film has been adhered; (c) providing a light-transmitting member in the opening; and (d) connecting, by flip-chip bonding, the wiring pattern of the substrate to the electrode pad of the solid-state image pickup device via a bump such that a light receiving section of the solid-state image pickup device receives light which has passed through the light-transmitting member.

According to the configuration, even when the anisotropically-conductive film between the substrate and the solid-state image pickup device is thrust aside by pressure and heat exerted for connecting the substrate to the solid-state image pickup device by flip-chip bonding, the part which is hardened while retaining the melted shape serves as a dam so that the anisotropically-conductive film will not be squeezed to the solid-state image pickup device and the like.

Moreover, since the substrate and the solid-state image pickup device are connected to each other by the flip-chip bonding, it is possible to bring about an effect of reducing a size and a thickness of the apparatus.

Therefore it is possible to provide the image pickup module and the like which can achieve reduction in size and thickness while removing the cause of defective image and the like.

DESCRIPTION OF EMBODIMENTS

[1. Configuration of Image Pickup Module]

The following description will discuss an embodiment of the present invention with reference to FIGS. 1 through 6. An image pickup module 1 of the present embodiment is provided and used in any of various kinds of image pickup apparatuses.

Figure 1:
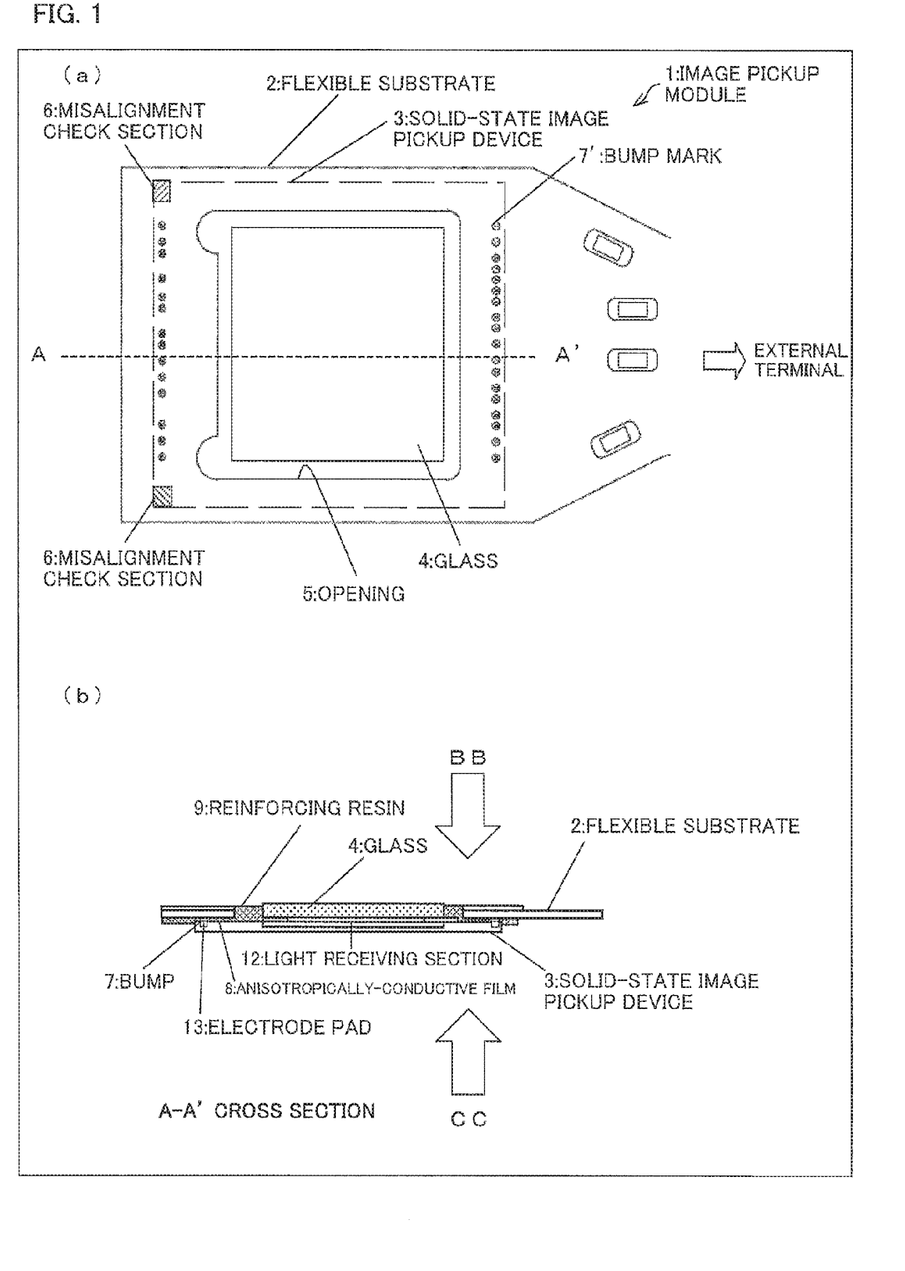
FIG. 1 is a view illustrating an image pickup module in accordance with an embodiment of the present invention, in which (a) shows a top view of the image pickup module and (b) shows a cross-sectional view taken along the line A-A' in (a) of FIG. 1.

FIG. 1 is a view illustrating a configuration of the image pickup module 1 in accordance with the present embodiment. (a) of FIG. 1 shows a top view of the image pickup module 1, and (b) of FIG. 1 shows a cross-sectional view taken along the line A-A' in (a) of FIG. 1. Note that, according to the present embodiment, a side of a flexible substrate 2 on which side a solid-state image pickup device 3 is provided is assumed to be a lower side, and the opposite side is assumed to be an upper side. Therefore, in (b) of FIG. 1, a state viewed in a direction BB is a state viewed from top (above), and a state viewed in a direction CC is a state viewed from bottom (below).

According to the image pickup module 1 of the present embodiment, the flexible substrate 2 has an opening 5 provided in a center of the flexible substrate 2, and an anisotropically-conductive film 8 is adhered to the flexible substrate 2 as a connecting member for connecting the flexible substrate 2 to a solid-state image pickup device 3 (see FIG. 1). The solid-state image pickup device 3 is connected to a terminal of the flexible substrate 2 via a bump 7, which is provided on an electrode (electrode pad 13) of the solid-state image pickup device 3, by flip-chip bonding (FCB). Moreover, a wiring pattern 11 is formed on the flexible substrate 2. The bump 7 is made of, for example, gold. Note that, when the flexible substrate 2 is viewed from an upper surface side (which is opposite to a side on which the solid-state image pickup device 3 is provided), a bump mark 7' can be seen which is a mark of the bump 7.

The solid-state image pickup device 3 is provided so as to cover the opening 5 in the flexible substrate 2.

In the opening 5 of the flexible substrate 2, a glass 4 is provided so as to cover a pixel area (light receiving section 12) of the solid-state image pickup device 3. An interface between the flexible substrate 2 and the solid-state image pickup device 3 is sealed with the anisotropically-conductive film 8. An interface between the flexible substrate 2 and the glass 4 is sealed with reinforcing resin 9.

The opening 5 formed by melting a periphery of a part to be cut out of the flexible substrate 2 with a laser beam or the like (this will be described later). From this, an edge of the opening 5 is in a semi-hardened state in which the anisotropically-conductive film 8, which has been melted, is hardened (i.e., hardened while retaining a melted shape which has been formed by the melting). That is, the flexible substrate 2, on which the anisotropically-conductive film 8 is being adhered, is cut out.

Figure 2:
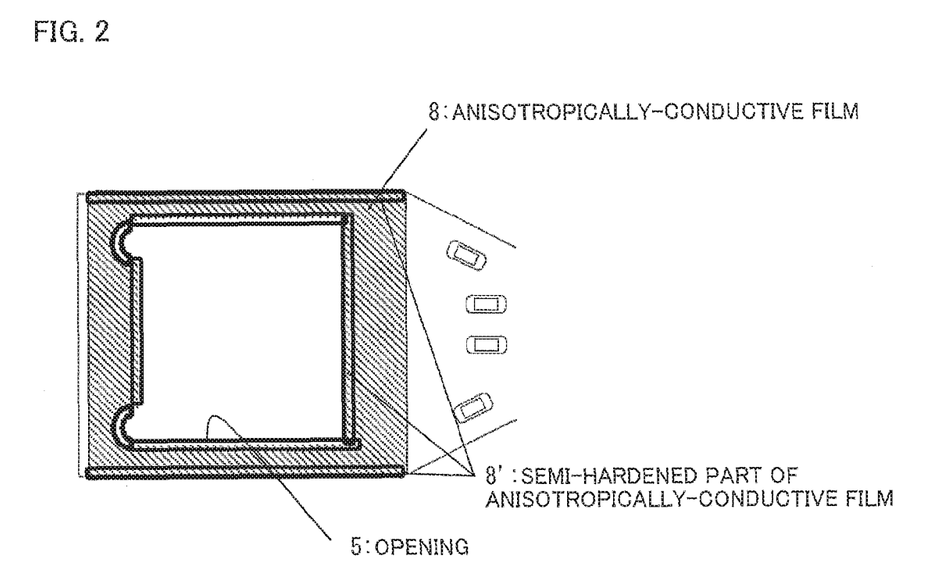
FIG. 2 is a view for explaining a semi-hardened part of an anisotropically-conductive film in the image pickup device.

Specifically, as illustrated in FIG. 2, the edge of the opening 5 and edges on long ides of the flexible substrate 2 are in the semi-hardened state (as indicated by semi-hardened parts 8 of anisotropically-conductive film in FIG. 2).

A length X of an edge on short side of the solid-state image pickup device 3 is substantially identical with a length Y of a short side of the flexible substrate 2. According to the present embodiment, (Length X of edge on short side of solid-state image pickup device 3)/(Length Y of shorter side of flexible substrate 2) is 0.9 or more.

At least two portions of the wiring pattern 11, which correspond to corners of the solid-state image pickup device 3, are quadrangularly cut out so as to form misalignment check sections 6. According to the present embodiment, each of the misalignment check sections 6 has a size of 100 μm-square. Note that details of the misalignment check section 6 will be described later.

One end of the flexible substrate 2 is extended in one direction, and an external terminal is provided on a part thus extended.

[2. Details of Misalignment Check Section 6]

Figure 3:
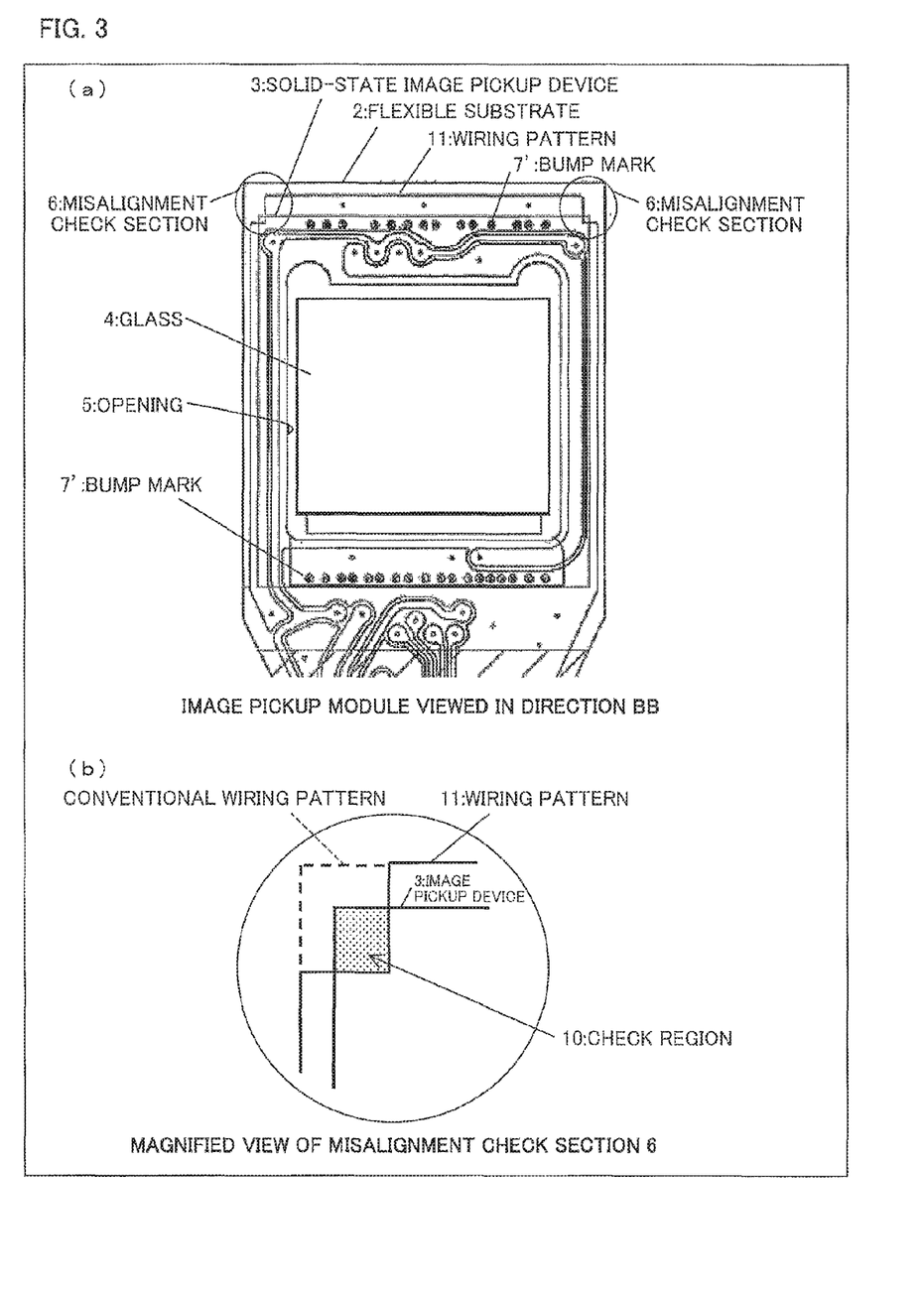
FIG. 3 is a view for explaining a misalignment check section in the image pickup device, in which (a) shows a top view of the image pickup device and (b) shows a magnified view of the misalignment check section shown in (a) of FIG. 3.
Figure 4:
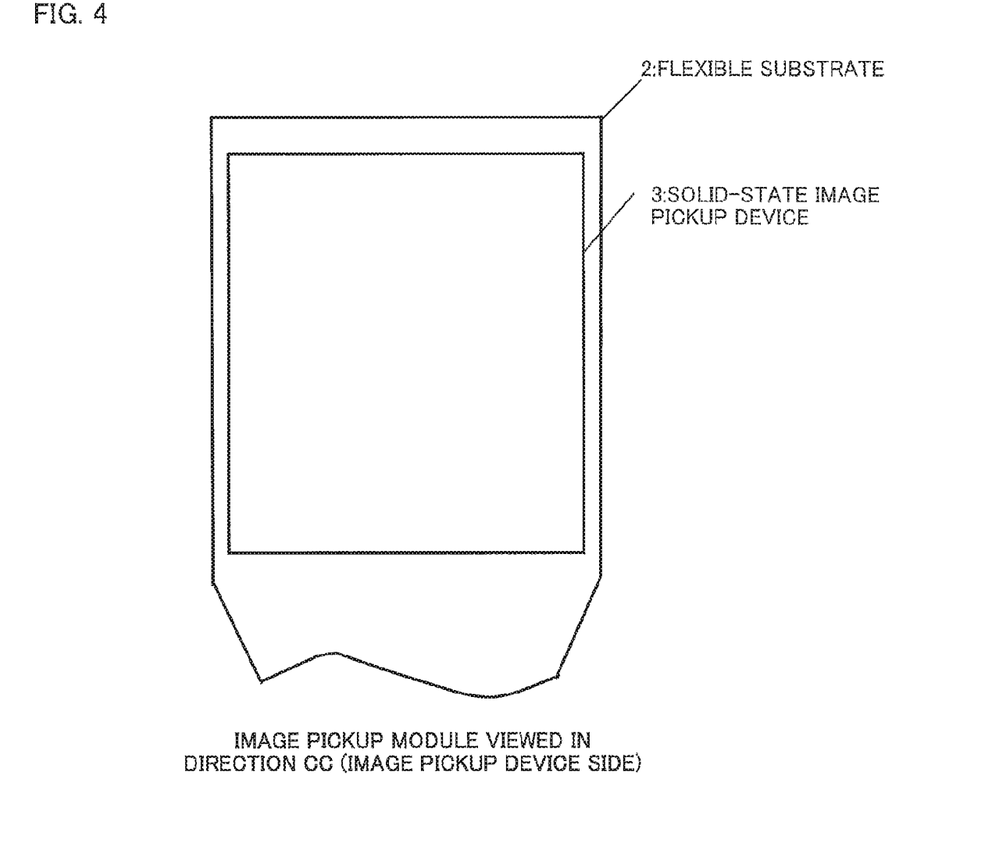
FIG. 4 is a view illustrating the image pickup device viewed in a direction opposite to (a) of FIG. 3.

The following description will discuss details of the misalignment check section 6, with reference to FIGS. 3 and 4. FIG. 3 is a view for explaining details of the misalignment check section 6. (a) of FIG. 3 shows a top view of the image pickup module 1, and (b) of FIG. 3 shows a magnified view of the misalignment check section 6. FIG. 4 is a view illustrating the image pickup module 1 viewed from the side on which the solid-state image pickup device 3 is provided.

The misalignment check section 6 is formed by quadrangularly cutting out a corner of the wiring pattern 11, and a corner of the solid-state image pickup device 3 appears in a cutout area (see (b) of FIG. 3). An area size of a part (check region 10) of the solid-state image pickup device 3 which part appears in the cutout area varies depending on a positional relation between the flexible substrate 2 and the solid-state image pickup device 3. From this, it is possible to check whether or not misalignment is caused between the flexible substrate 2 and the solid-state image pickup device 3, by comparing an area of the check region 10 in a case of an adequate positional relation between the flexible substrate 2 and the solid-state image pickup device 3 with (ii) a measured area of the check region 10.

[3. Positional Relation Between Terminal of Wiring Pattern 11 and Bump 7]

Figure 5:
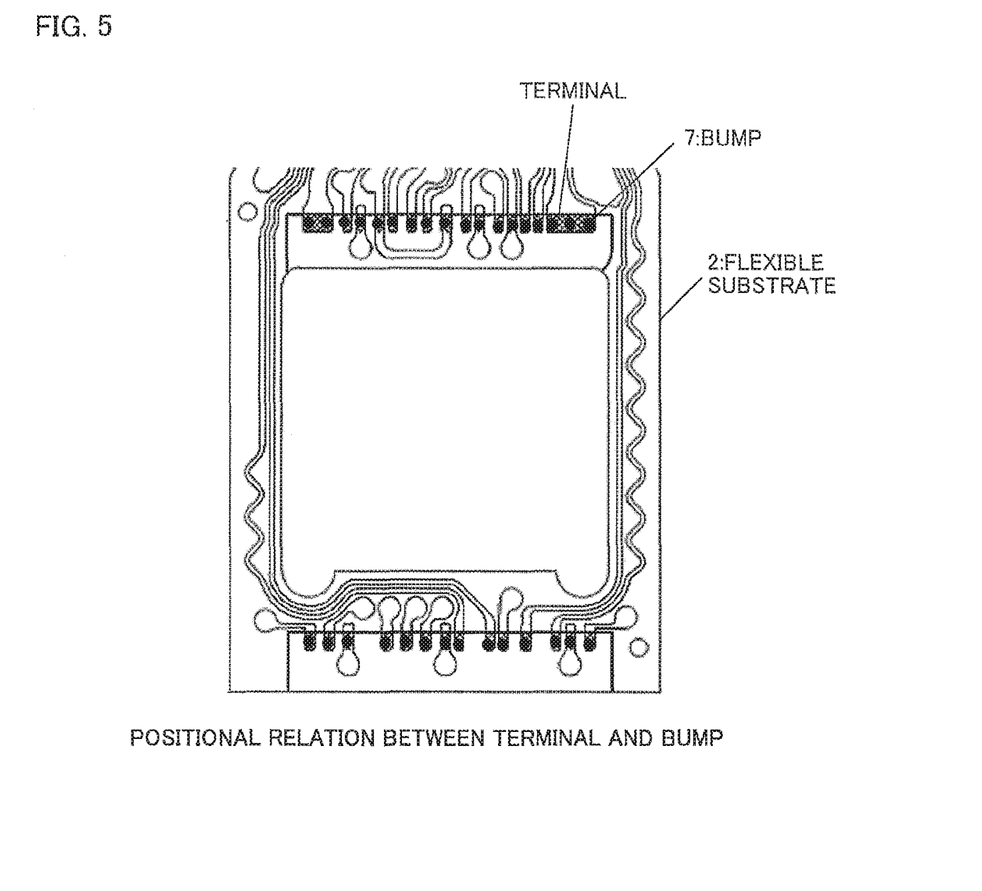
FIG. 5 is a view illustrating a positional relation between a terminal of a flexible substrate and a bump in the image pickup device.

The following description will discuss a positional relation between a terminal of the wiring pattern 11 and the bump 7 with reference to FIG. 5. FIG. 5 is a view illustrating a positional relation between an electrode of the wiring pattern 11 and the bump 7.

In FIG. 5, the bump 7 is indicated by a black circle. As illustrated in FIG. 5, the bump 7 is provided in a terminal part of the wiring pattern 11.

[4. Method for Manufacturing Image Pickup Module 1]

Figure 6:
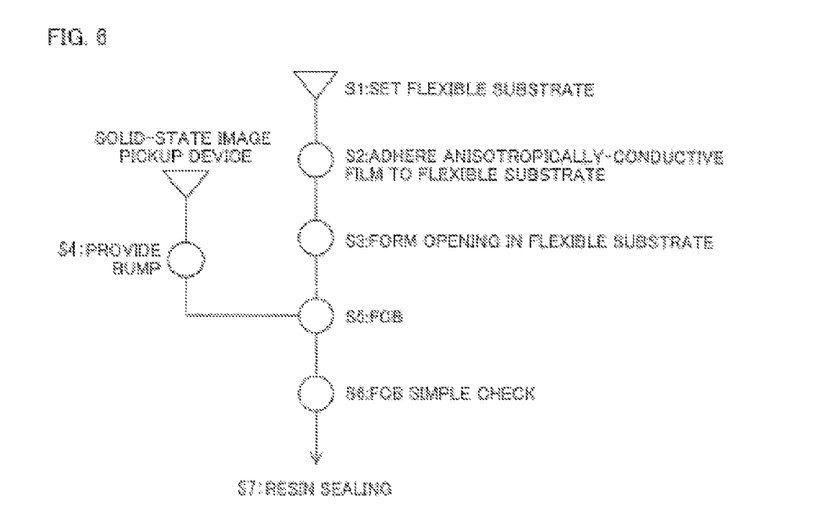
FIG. 6 is a flowchart illustrating a flow of manufacturing the image pickup device.

The following description will discuss a method for manufacturing the image pickup module 1, with reference to FIG. 6. FIG. 6 is a flowchart illustrating a flow of manufacturing the image pickup module 1.

First, a flexible substrate 2 on which a wiring pattern. 11 has been formed is set (S1). Next, an anisotropically-conductive film 8 is adhered to the flexible substrate 2 thus set (S2). The anisotropically-conductive film 8 is an ACF (anisotropic conductive film), a NCF (non conductive film), or the like.

Then, an opening 5 is formed by melting the flexible substrate 2, on which the anisotropically-conductive film 8 is being adhered, with a laser beam or the like (S3). More specifically, a process for forming the opening 5, in which a pixel area of a solid-state image pickup device 3 is to be disposed, is carried out by melting the flexible substrate 2 with a laser beam or the like. Moreover, processing of a cutout line, which includes a resin feeding section via which resin is fed for fixing the glass 4 and reinforcing fixation between the glass 4 and the flexible substrate 2, is also carried out by melting with a laser beam or the like.

By carrying out the processing by melting, hardening reaction of the anisotropically-conductive film 8 occurs in the vicinity (approximately 20 urn) of a processed part. Therefore, even when the anisotropically-conductive film 8 between the solid-state image pickup device 3 and the flexible substrate 2 is thrust aside by pressure and heat exerted for connecting (in a next step) the solid-state image pickup device 3 to the terminal of the flexible substrate 2 by flip-chip bonding, a semi-hardened part of the anisotropically-conductive film 8 (i.e., semi-hardened part 8' of the anisotropically-conductive film) serves as a dam so that the anisotropically-conductive film 8 will not be squeezed out of the flexible substrate 2.

According to the image pickup module 1 which is demanded, for reducing a size, to have a size substantially identical with that of the solid-state image pickup device 3, the solid-state image pickup device 3 and the flexible substrate 2 have substantially identical widths. In this case, in order to secure reliability in connection between the solid-state image pickup device 3 and the flexible substrate 2, a resin for reinforcement needs to be provided around the solid-state image pickup device 3.

However, in a case where the solid-state image pickup device 3 and the flexible substrate 2 have the substantially identical widths, an area to which the resin can be applied is limited. Therefore, according to the conventional technique, it was difficult to produce the image pickup module 1 that secures reliability in connection between the flexible substrate 2 and the solid-state image pickup device 3 while achieving a reduction in size of the image pickup module 1.

According to the present embodiment, the anisotropically-conductive film 8 is adhered to the flexible substrate 2. Therefore, a dam can be formed when the anisotropically-conductive film 8 is melted and hardened in cutting out the flexible substrate 2 by a laser beam so as to form a contour of the flexible substrate 2.

The dam is completely hardened, earlier than the connection part, by heat (e.g., 200° C.) for connecting the solid-state image pickup device 3 to the flexible substrate 2 by flip-chip bonding. This makes it possible to prevent the anisotropically-conductive film 8 in the connection part from being squeezed to the outside.

This makes it possible to provide the image pickup module 1 that secures reliability in connection between the solid-state image pickup device 3 and the flexible substrate 2 while achieving a reduction in size.

Moreover, the anisotropically-conductive film 8 is adhered to the flexible substrate 2 in advance, and it is therefore possible to reduce the number of processes and to reduce cost for manufacturing the image pickup module 1.

It is preferable to partially provide a resin pocket (not illustrated) when the processing by the laser beam is carried out. This makes it possible to enhance stability in injecting liquid resin. Moreover, even in a case where excessive liquid resin is injected, an excess can be caused to remain in the resin pocket, and it is therefore possible to prevent the liquid resin from overflowing out of the flexible substrate 2. Note that the resin pockets can be provided, for example, at respective four corners of the glass 4.

Meanwhile, a bump 7 is formed on the electrode pad of the solid-state image pickup device 3 (S4).

Then, the solid-state image pickup device 3, in which the bump 7 has been formed on the electrode pad, is connected, by flip-chip bonding, to a terminal of the flexible substrate 2 having the opening 5 (S5).

After the connection by flip-chip bonding, a backside of the solid-state image pickup device 3 is checked, that is, a bump mark 7' is checked from the upper side of the image pickup module 1. Further, in each of at least two misalignment check sections 6 of the flexible substrate 2, an area of a check region 10 is checked which is a corner of the solid-state image pickup device 3 extending beyond the wiring pattern 11 (S6).

Conventionally, electrical characteristics checking, which is carried out by the use of an X-ray transmission technique and a jig, has been employed for checking an apparatus in which a semiconductor chip like the solid-state image pickup device 3 and a substrate like the flexible substrate 2 are connected, by flip-chip bonding, to each other via a connecting member like the anisotropically-conductive film 8 having electrical conductivity. A connection part is unseen and therefore misalignment between a location of a bump of the semiconductor chip and a location of a terminal of the substrate is checked by X-ray transmission. However, when the semiconductor chip is irradiated with an X-ray, a dark current is increased, and this causes device degradation. Therefore, a checked sample is discarded. Moreover, after checking the misalignment by X-ray transmission, electrical characteristics checking is carried out with the use of a jig. As such, the jig is required to carry out the electrical characteristics checking, and this causes an increase in cost.

In view of this, as a result of studies, the inventor of the present invention has found it possible to confirm stable connection by confirming that, when the solid-state image pickup device is connected to the flexible substrate 2 by flip-chip bonding, the bump mark appears, on a backside of the flexible substrate 2 on which the solid-state image pickup device 3 has been provided, on a location corresponding to a location of the bump. As such, by confirming the bump mark 7', it is possible to confirm whether or not the flip-chip bonding is appropriately made.

Moreover, there has conventionally been no method to confirm misalignment between the terminal of the flexible substrate 2 and the bump 7 of the solid-state image pickup device 3 in a case where the flexible substrate 2 and the solid-state image pickup device 3 have substantially identical sizes. This is because, even if a misalignment check mark is provided on the substrate, the misalignment check mark cannot be confirmed due to a thrust connecting member.

In view of this, according to the present embodiment, portions of the wiring pattern 11, which portions correspond to respective corners of the solid-state image pickup device 3, are cut out in a quadrangular shape, and misalignment between the terminal of the flexible substrate 2 and the bump 7 of the mobile terminal 3 is confirmed based on an area of a portion of the solid-state image pickup device 3 which portion appears in each cutout.

This makes it possible to surely confirm the misalignment between the terminal of the flexible substrate 2 and the bump 7 of the mobile terminal 3, and this allows reduction in cost.

By the steps described above, the image pickup module 1 can be manufactured.

[5. Effects of Present Embodiment]

As above described, according to the image pickup module 1 of the present embodiment, the anisotropically-conductive film 8, which is a connecting member which has electrical conductivity and via which the solid-state image pickup device 3 and the flexible substrate 2 are connected to each other, is adhered to the flexible substrate 2 in advance, and the opening 5, which corresponds to the pixel area of the solid-state image pickup device 3, is formed by the process of melting the flexible substrate 2. Then, the flexible substrate 2 and the solid-state image pickup device 3 are connected to each other by flip-chip bonding.

In this case, at the edge (approximately 20 um) of the opening 5 thus formed by the melting process, the anisotropically-conductive film 8 which is the connecting member is semi-hardened by hardening reaction. Therefore, even when the anisotropically-conductive film 8 between the solid-state image pickup device 3 and the flexible substrate 2 is thrust aside by pressure and heat exerted for connecting (in a next step) the solid-state image pickup device 3 to the flexible substrate 2 by flip-chip bonding, the semi-hardened part 8' of the anisotropically-conductive film serves as a dam so that the anisotropically-conductive film 8 will not be squeezed out of the flexible substrate 2. This makes it possible to remove the cause of defective image and the like.

Moreover, it is possible to configure the image pickup module 1 in which the flexible substrate 2 and the solid-state image pickup device 3 have substantially identical short side lengths. It is therefore possible to provide the image pickup module 1 which is smaller in size and thickness.

The present invention can be expressed as follows. That is, the image pickup module of the present invention includes: a solid-state image pickup device having a light receiving section and an electrode pad; a substrate having an opening, a wiring pattern which is connected to the electrode pad by flip-chip bonding being formed on the substrate; an anisotropically-conductive film which is adhered to the substrate so that the substrate and the solid-state image pickup device are connected to each other via the anisotropically-conductive film; and a light-transmitting member provided in the opening, the light-transmitting member causing light to pass through so that the light is to be received by the light receiving section, the opening being formed by melting the substrate and the anisotropically-conductive film, and at an edge of the opening, the anisotropically-conductive film being hardened while retaining a melted shape which has been formed by the melting.

The method of the present invention for manufacturing an image pickup module is a method for manufacturing an image pickup module in which a solid-state image pickup device having an electrode pad is provided on a substrate on which a wiring pattern is formed, the method including the steps of: (a) adhering an anisotropically-conductive film to the substrate; (b) forming an opening by melting a periphery of a part to be cut out of the substrate to which the anisotropically-conductive film has been adhered; (c) providing a light-transmitting member in the opening; and (d) connecting, by flip-chip bonding, the wiring pattern of the substrate to the electrode pad of the solid-state image pickup device via a bump such that a light receiving section of the solid-state image pickup device receives light which has passed through the light-transmitting member.

According to the configuration or the method, the anisotropically-conductive film at the edge of the opening is hardened while retaining the melted shape which has been formed by the melting. Therefore, even when the anisotropically-conductive film between the substrate and the solid-state image pickup device is thrust aside by pressure and heat exerted for connecting the substrate to the solid-state image pickup device by flip-chip bonding, the part which is hardened while retaining the melted shape serves as a dam so that the anisotropically-conductive film will not be squeezed to the solid-state image pickup device and the like.

Moreover, since the substrate and the solid-state image pickup device are connected to each other by the flip-chip bonding, it is possible to reduce a size and a thickness of the apparatus.

Therefore it is possible to provide the image pickup module and the like which can achieve reduction in size and thickness while removing the cause of defective image and the like.

According to the image pickup module of the present invention, an outside length on a short side of the solid-state image pickup device can be 90% or more of an outside length on a short side of the substrate.

According to the configuration, the substrate can be configured to have an external size which is substantially identical with that of the solid-state image pickup device. This makes it possible to further reduce the size of the apparatus.

According to the image pickup module of the present invention, the substrate can be a flexible printed circuit board.

According to the image pickup module of the present invention, an interface between the substrate and the solid-state image pickup device can be sealed by resin.

According to the configuration, the interface is sealed by the resin, and it is possible to reinforce the connection between the substrate and the solid-state image pickup device.

According to the image pickup module of the present invention, it is possible that one end of the substrate is extended in one direction, and an external terminal is provided on an extended part of the substrate.

According to the configuration, it is possible to assemble by folding the external terminal of the substrate.

According to the image pickup module of the present invention, it is possible that the wiring pattern is formed in a quadrangular region; and at least two of four corners of the quadrangular region are cut out.

According to the configuration, the solid-state image pickup device is to partially appear in cutout parts of the quadrangular region in which the wiring pattern is formed.

Further, it is possible to check whether or not the solid-state image pickup device and the wiring pattern are connected to each other at a correct location, with reference to an area of the solid-state image pickup device which appears in each of the cutout parts in a case where the solid-state image pickup device and the wiring pattern are connected to each other at the correct location.

The method of the present invention for manufacturing the image pickup module can further includes the step of (e) confirming a bump mark on the substrate after the step (d).

According to the method, it is possible to check, by confirming the bump mark, whether or not the flip-chip bonding has been correctly carried out.

The present invention is not limited to the embodiments, but can be altered by a skilled person in the art within the scope of the claims. That is, embodiments obtained by suitable combinations of technical means modified within the scope of the accompanying claims are also included within the technical scope of the present invention.

INDUSTRIAL APPLICABILITY

The present invention is suitable for a small solid-state image pickup module such as a camera for information communication terminal, an in-vehicle camera, and a camera for medical purposes, each of which includes a solid-state image pickup device.

REFERENCE SIGNS LIST

1: Image pickup module
2: Flexible substrate (flexible printed circuit board)
3: Solid-state image pickup device
4: Glass (light-transmitting member)
5: Opening
6: Misalignment check section
7: Bump
8: Anisotropically-conductive film
9: Reinforcing resin
10: Check region
11: Wiring pattern
12: Light receiving section
13: Electrode pad

The invention claimed is:

1. A method for manufacturing an image pickup module in which a solid-state image pickup device having an electrode pad is provided on a substrate on which a wiring pattern is formed, said method comprising the steps of:
  (a) adhering an anisotropically-conductive film to the substrate;
  (b) forming an opening by melting (i) a periphery of a part to be cut out of the substrate to which the anisotropically-conductive film has been adhered, and (ii) a periphery of a part to be cut out of the anisotropically-conductive film which has been adhered to the substrate;
  (c) providing a light-transmitting member in the opening; and
  (d) connecting, by flip-chip bonding, the wiring pattern of the substrate to the electrode pad of the solid-state image pickup device via a bump such that a light receiving section of the solid-state image pickup device receives light which has passed through the light-transmitting member,
  wherein, at an edge of the opening formed in the step (b), the anisotropically-conductive film is semi-hardened after the melting and forms a dam in a semi-hardened state, and then the dam is completely hardened by heat for the flip-chip bonding, earlier than a connection part between the wiring pattern and the electrode pad.

* * * * *